United States Patent [19]

Smith et al.

[11] Patent Number: 5,161,092
[45] Date of Patent: Nov. 3, 1992

[54] CIRCUIT CARD ASSEMBLY CONDUCTION CONVERTER

[75] Inventors: William A. Smith, Laguna Hills; Eugene L. Brodie, Anaheim, both of Calif.

[73] Assignee: Hughes Aircraft Company, Los Angeles, Calif.

[21] Appl. No.: 724,695

[22] Filed: Jul. 2, 1991

[51] Int. Cl.⁵ .............................. H05K 7/20
[52] U.S. Cl. .................... 361/387; 165/185; 174/52.2; 361/395
[58] Field of Search ............ 361/382, 386–389, 361/395, 399, 400, 405, 415; 165/46, 104.15, 80.3, 185; 174/16.3, 52.2, 252; 211/41; 357/81

[56] References Cited

U.S. PATENT DOCUMENTS

| | | | |
|---|---|---|---|
| 3,764,856 | 10/1973 | Martin | 361/386 |
| 4,366,526 | 12/1982 | Lijoi | 361/385 |
| 4,621,304 | 11/1986 | Oogaki | 361/386 |
| 4,811,165 | 3/1989 | Currier | 361/386 |
| 4,899,256 | 2/1990 | Sway-Tin | 361/386 |
| 4,965,699 | 10/1990 | Jorden | 361/387 |
| 4,979,074 | 12/1990 | Morley | 361/386 |

Primary Examiner—Gerald P. Tolin
Attorney, Agent, or Firm—Wanda K. Denson-Low

[57] ABSTRACT

The thermal mounting plate has a pocket therein which contains dielectric elastomer. The pins on the pin side of the circuit card assembly engage in the elastomer to conduct heat from the components through the pins and elastomer into the thermal mounting plate. The thermal mounting plate mounts into a cooled card box for heat removal.

5 Claims, 2 Drawing Sheets 5,161,092

CIRCUIT CARD ASSEMBLY CONDUCTION CONVERTER

FIELD OF THE INVENTION

This invention relates to the adaption for conduction cooling of a circuit card assembly which was originally designed for convection cooling. The adaptation comprises providing a thermal mounting plate with a recess therein and a dielectric thermally conductive material in the recess. The pin side of the circuit card assembly is engaged against the thermal mounting plate with the pins in the dielectric. Heat is conducted out of the components through the pins into the dielectric and into the thermal mounting plate.

BACKGROUND OF THE INVENTION

Semiconductor components are mounted on a printed wiring board, usually on one side thereof. Cooling of such printed wiring boards with their associated semiconductor devices is required to keep the semiconductor devices below their critical temperature. The most common way of cooling such circuit card assemblies is by blowing air thereover. Of course, such air cooling has definite limits as to the amount of heat that can be removed, especially when the circuit card assembly is densely packed with electronic components or applied in an environment where direct external air impingement to the circuit card is undesirable or forbidden. Furthermore, such circuit card assemblies must be spaced so that adequate air can flow therebetween for cooling. Conductive cooling has been attempted by fitting thermal mounting plates directly against the semiconductor device packages, usually between the components and the circuit card. Such thermal mounting plates are difficult to construct and often have poor thermal pathways due to long, thin thermal conductive sections. The thickness of the material is limited due to component lead lengths, and the thickness of the printed wiring board. Attempts to cool the semiconductor packages on the circuit card assembly by contact with the packages themselves have the difficulty of requiring individual fitting of the cooler, due to the different configurations and positions of the packages. Furthermore, a cooler on the component side of the device must be removed before the circuit card assembly can be serviced. There is still need for a conduction cooling structure and method of making the structure by which a group of various sized electronic packaged devices assembled on a circuit card can be conductively cooled.

The uniqueness of this invention is that it provides a structure and method for cooling circuit card assemblies, that were designed for direct air impingement convection cooling, by means of conduction without redesigning the circuit card. It provides a cooler which can be applied to any circuit card assembly of the same size without reference to the positions and types of components thereon. The cooler will cool the electronic components conductively in a manner equal to or superior to forced convection cooling.

SUMMARY OF THE INVENTION

In order to aid in the understanding of this invention, it can be stated in essentially summary form that it is directed to a pin-side cooler for a circuit card assembly and the method of cooling a circuit card assembly wherein the thermal mounting plate carries thereon a soft dielectric material of high thermal conductivity. The pins extending from the pin side of the circuit card assembly are pressed into the dielectric for transfer of heat from the components into the thermal mounting plate. The method includes the steps of forming the thermal mounting plate with its dielectric thermal conductor and pressing the pins on the side of the circuit card into the dielectric.

It is thus a purpose and advantage of this invention to provide a conductive cooler which engages on the pins extending from the pin side of a circuit card assembly so as to extract heat from the components through their pins.

It is a further purpose and advantage of this invention to provide a conduction converter which has a soft dielectric thereon so that any circuit card of the same general shape can be cooled by the cooler, irrespective of the number, position and type of components on the circuit card assembly.

It is a further purpose and advantage of this invention to add a pin-side cooler to any existing circuit card assembly so that the circuit card assembly will be converted to conduction cooling by conductively cooling each of the components through the pins without rearranging the components on the circuit card to minimize the thermal path length of the highest dissipating components to the edges of the card.

It is a further purpose and advantage of this invention to provide a method by which a circuit card assembly can be cooled from the pin side of the circuit card assembly with convenient separation of the thermal mounting plate from the circuit card assembly for repair of the circuit card assembly.

Other purposes and advantages of this invention will become apparent from a study of the following portion of this specification, the claims and the attached drawings wherein:

DESCRIPTION OF THE PREFERRED EMBODIMENT

Figure 1:
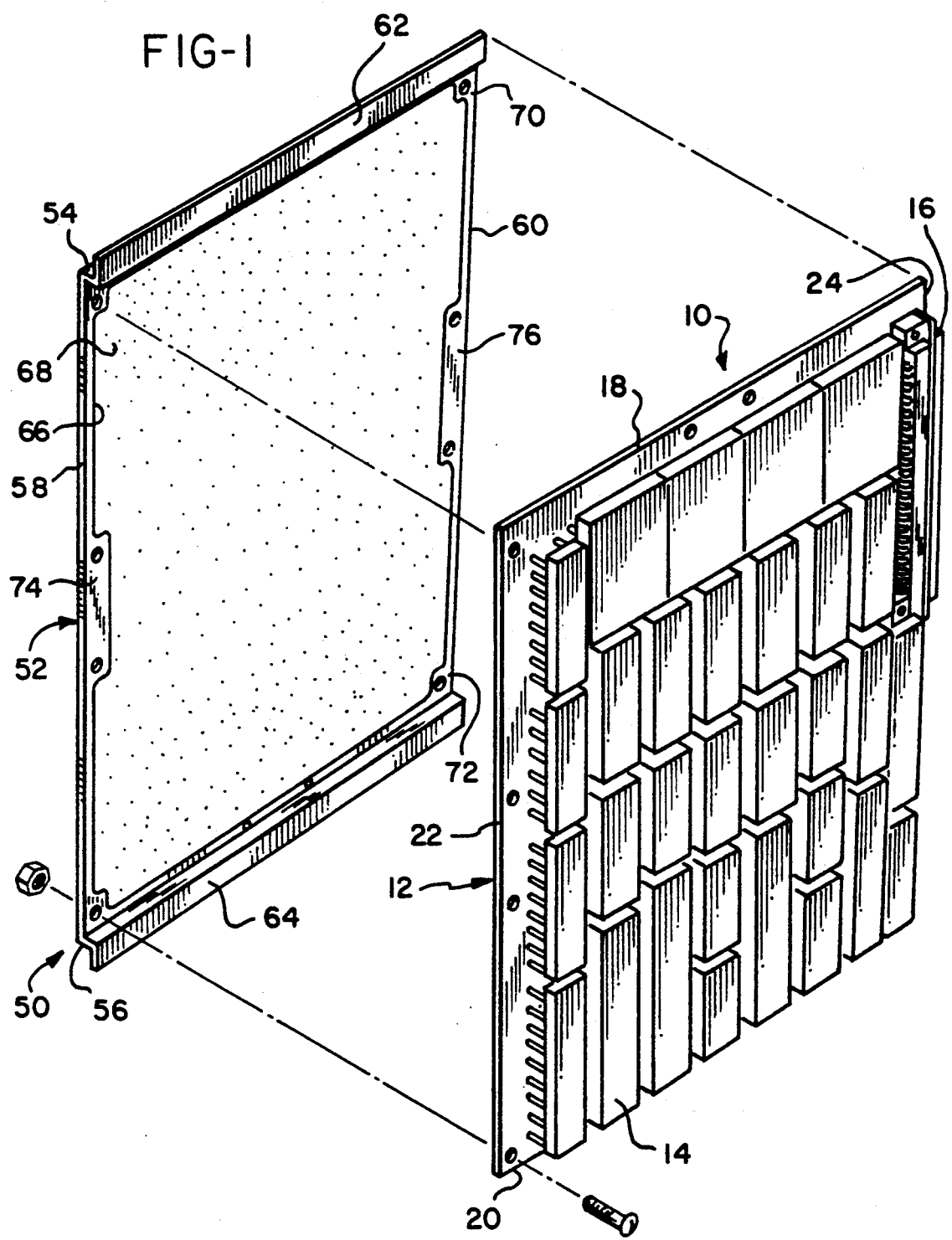
FIG. 1 is an exploded isometric view showing the pin-side cooler of this invention with a circuit card assembly in exploded position.

A circuit card assembly is generally indicated at 10 in FIG. 1. The circuit card assembly 10 comprises a printed wiring board 12 on which is mounted a group of electronic circuit devices. The devices may be resistors or capacitors, but are more usually semiconductor devices. The semiconductor devices may be single junction devices or may be integrated circuit devices. Each of the devices is in its own package which has multiple external connections for connection to the circuitry in the printed wiring board. Electronic device 14 is particularly indicated in FIGS. 1 and 2 as exemplary of the plurality of devices mounted on and electrically connected to the printed wiring board 12. While a series of rectangular electronic devices is shown in FIG. 1, in most cases the electronic devices will have various sizes and shapes. Furthermore, the devices mounted on the board 12 may include a connector device such as the connector device 16. The printed wiring board 12 may be a single layer printed wiring board or may be a multiple layer board with circuit traces at intermediate levels. The circuit board 12 is shown as terminating at ends 18 and 20 and edges 22 and 24. The ends and edges define the lateral dimensions of the printed wiring board. In accordance with certain specifications, there are standard sizes of these printed wiring boards.

In complex circuits, there is usually a plurality of circuit card assemblies, with each assembly lying parallel and next to each other so that, in conventional card boxes, air can be blown thereafter for convective cooling of the electronic devices in the assemblies. For dense circuitry or those whose environment does not allow direct air impingement to the circuit card, such convection cooling is not appropriate, and conduction cooling is more favorable in removing the heat generated. In accordance with this invention, a pin-side cooler is provided for each circuit card assembly to remove the heat generated by electrical resistance in the circuit card assembly.

Figure 2:
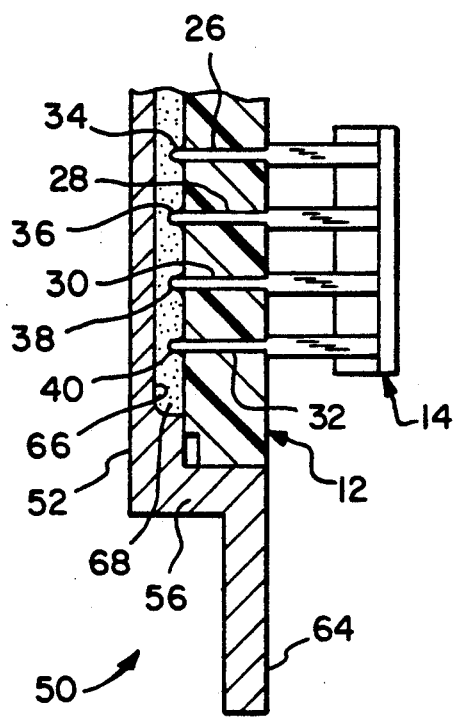
FIG. 2 is an enlarged section through the pin-side cooler together with a circuit card thereon, with parts broken away.

The electronic devices are connected to the circuit board by means of a plurality of pins. These pins are arranged in rows, with the simpler devices having one row around each long edge of the electronic device to form a dual row of in-line pins. Other devices may have more rows of connecting pins. The pins extend from the device and are electrically connected to the circuitry therein. The pins extend through the printed wiring board through openings in pads on the printed wiring board on the opposite side from the devices. Wave soldering is often employed to solder the large number of pins, each to their corresponding pad. As seen in FIG. 2, the electronic device 14 has four pins 26, 28, 30 and 32, which extend through corresponding openings in the printed wiring board and extend through openings in solder pads on the printed wiring board on the side opposite the device 14. These pads are indicated at 34, 36, 38 and 40. The particular circuit card assembly 10 is a standard card configured for air cooling. When all the electronic devices are positioned, they are soldered in place, as by wave soldering. After soldering, the pins are cut off to a uniform length, such as 0.025 inch below the bottom surface of the printed wiring board opposite the device 14. Solder fillets form on the pins and pads to electrically connect the electronic devices to the board circuitry and to secure the electronic devices to the board. Such printed wiring boards and circuit card assemblies are to standard design and are useful in that condition. In some circuit boards, sockets are provided so that electronic devices with pins thereon can be removably plugged in. These plug-in devices are especially useful for convenience of repair or change. For cooling devices from the pin side, in accordance with this invention, it is preferable to employ devices with their pins soldered at the back side of the board. This improves thermal conductivity, as compared to the employment of plug-in sockets.

In order to improve the cooling of the circuit card assembly, the thermal mounting plate 50 is provided. The center section 52 has upturned flanges 54 and 56 as its ends. These flanges serve as locating flanges for the circuit card assembly 10. The space between the flanges is slightly greater than the length of the circuit card assembly between ends 18 and 20. The width of the center section between edges 58 and 60 is the same as the width of the circuit card assembly between its edges 22 and 24. Webs 62 and 64 are formed on the upturned flanges and are at a height equal to the thickness of the printed wiring board 12, see FIG. 2. Between the flanges and edges of the thermal mounting plate, pocket 66 is formed. The pocket 66 receives dielectric, resilient elastomer 68, which is of the highest thermal conductivity consistent with the requirement that it be dielectric. The elastomer fills the pocket so that the attachment surface, the side seen in FIG. 1, is substantially planar.

The material of the thermal mounting plate is metal to maximize thermal conductivity. Copper is the preferred material, and aluminum is also a likely candidate. In the specific example given, copper is the material of the thermal mounting plate, and the thickness of the center section is 0.080 inch. The pocket is 0.040 inch deep. It should be noted in FIG. 1 that there is a rim around the pocket 66, all the way around the thermal mounting plate, against which the printed wiring board side of the circuit card assembly can rest. In addition, pads are provided at each of the corners of the pocket to provide a sufficient area to receive fastener openings. Pads 70 and 72 are shown in FIG. 1 at the right side of the thermal mounting plate, and an unidentified corresponding pair is also shown at the left side. Additionally, pads are provided along each of the long sides of the thermal mounting plate. Pads 74 and 76 are specifically identified.

The pocket is prepared for receiving the elastomer by the spraying of the pocket with a silicone primer. General Electric silicone SS4155 is found to be suitable. The elastomer 68 is then filled into the pocket and leveled with a doctor blade. Eccosil 4954 was found to be a suitable elastomer. After the elastomer was put in place, it was covered with a vacuum bag and placed in a vacuum chamber long enough for substantially all of the gases to be extracted from the pocket and the elastomer. The elastomer receives the pins on the pin side of the circuit card assembly and, in order to prevent sticking, the pin side of the circuit card assembly was sprayed with a fluorocarbon dry film release agent, such as Miller-Stevenson MS 122. The pocket is configured so that all of the pins are received in the elastomer. The pads are away from the pin areas. In order to secure the circuit card assembly in place, machine screw openings are provided through the circuit card assembly adjacent the edges thereof and through the pads in the thermal mounting plate. When they are assembled, fasteners such as machine screws or bolts hold the circuit card assembly in place against the thermal mounting plate. As is seen in FIG. 2, the thickness of the elastomer is such that the pins do not reach the thermal mounting plate, but are electrically isolated therefrom. They are thermally connected to the thermal mounting plate through the elastomer.

Figure 3:
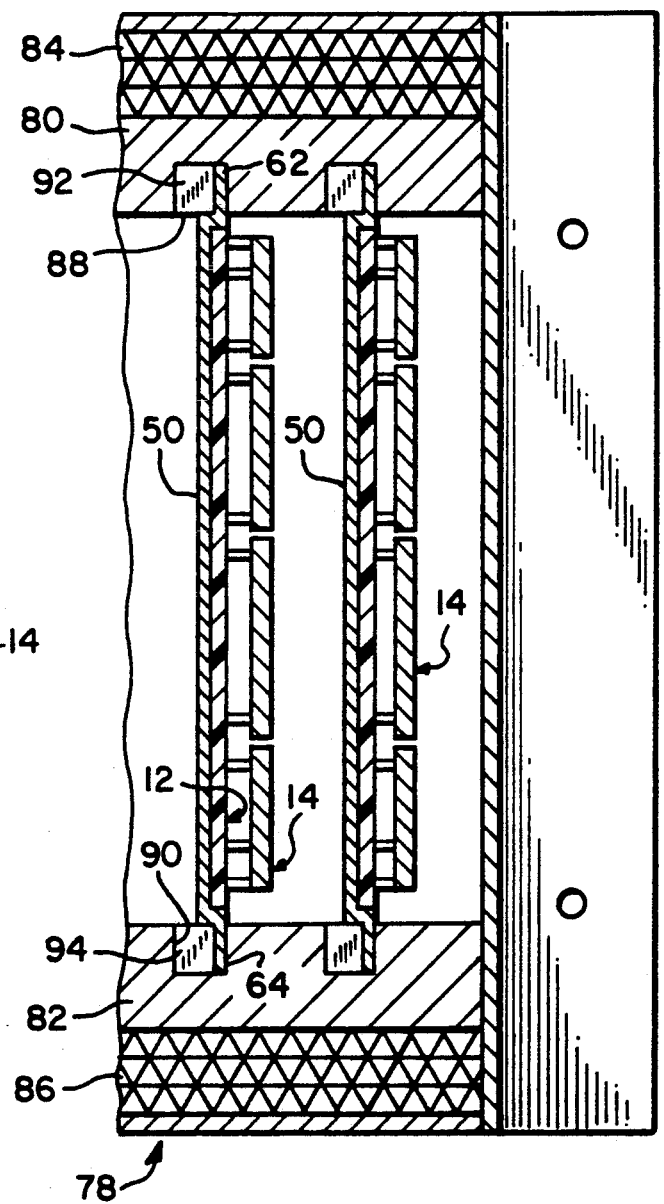
FIG. 3 is a transverse section through a card box containing a plurality of the pin-side coolers associated with circuit card assemblies in accordance with this invention.

Card box 78 is shown in FIG. 3. Card box 78 receives, retains and protects a plurality of the circuit card assemblies and places them so that they can be interconnected with other circuit card assemblies and other electronic components. Card box 78 has two cold plates 80 and 82 which respectively have heat removed therefrom by means of heat exchangers 84 and 86. These heat exchangers may be gas-, liquid- or refrigerant-cooled, depending upon available mediums. The cold plates have notches therein to receive the ends of the thermal mounting plates which hold the cards. Notches 88 and 90 respectively receive the upper and lower webs 62 and 64 of the thermal mounting plate 50. In order to lock the thermal mounting plate in place and to provide mechanical force which maintains good thermal contact, wedges 92 and 94 are placed in the notches next to the webs to clamp the webs in place. In this way, heat is extracted from the electronic devices, where it is generated, through the pins and through the elastomer into the thermal mounting plate. The thermal mounting plate is cooled by being clamped into the cold plates.

Removal of a circuit card assembly is achieved by releasing the wedges, withdrawing the circuit card assembly and its associated thermal mounting plate, while at the same time disconnecting the electronic connection. When removed in that way, the screws attaching the circuit card assembly to the thermal mounting plate can be removed and the circuit card assembly lifted off of the thermal mounting plate. Now the circuit card assembly is available for testing, repair and/or replacement.

This invention has been described in its presently contemplated best modes, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. An assembly for providing conductive cooling, said assembly including a circuit card which has been previously designed to be convectionally cooled, said circuit card being of the type having a first side upon which electronic components are mounted and a second side from which pins of said electronic components extend through corresponding openings in said circuit card and are soldered to solder pads on the second side of the circuit card, said assembly comprising:

a thermal mounting plate of high thermal conductivity material, said thermal mounting plate having a raised peripheral flat rim conforming to the outside border of said circuit card, said peripheral rim defining a pocket of said thermal mounting plate;

a layer of electrically nonconductive, thermally conductive elastomeric material filling said pocket of said thermal mounting plate up to said rim;

fastener means coupling the outside border of the second side of said circuit card against the perimeter flat rim of said thermal mounting plate, said perimeter rim being of a height above the surface of said mounting plate such that said pins extend into said layer of elastomeric material but do not extend to the surface of said thermal mounting plate; and means coupling said mounting plate to a heat removal means.

2. An assembly for providing conductive cooling for a circuit card as recited in claim 1 wherein said means coupling said thermal mounting plate to a heat removal means comprises:

a flange on a least one end of said mounting plate, said flange being extending outside said rim and raised above said rim by the thickness of said circuit card.

3. An assembly for providing conductive cooling for a circuit card as recited in claim 2 further including:

a cold plate; and means thermally coupling said flange to said cold plate.

4. An assembly for providing conductive cooling for a circuit card as recited in claim 3 further including:

heat sink exchanger means for removing heat from said cold plate.

5. An assembly for providing conductive cooling for a circuit card as recited in claim 1 wherein said circuit card has holes disposed around its periphery and said fastener means includes:

said rim having pads, said pads having holes corresponding to the holes in said circuit card, fasteners received in said respective holes.

* * * * *